United States Patent [19]

Matsuoka

[11] Patent Number: 5,053,349
[45] Date of Patent: Oct. 1, 1991

[54] METHOD FOR INTERCONNECTING SEMICONDUCTOR DEVICES

[75] Inventor: Fumitomo Matsuoka, Kawasaki, Japan

[73] Assignee: Kabushiki Kaisha Toshiba, Kawasaki, Japan

[21] Appl. No.: 360,278

[22] Filed: Jun. 2, 1989

[30] Foreign Application Priority Data

Jun. 16, 1988 [JP] Japan ................................. 63-149152

[51] Int. Cl.[5] ........................................... H01L 21/70
[52] U.S. Cl. ...................................... 437/41; 437/34; 437/40; 437/56; 437/192; 437/193; 437/200; 437/228
[58] Field of Search ....................... 437/29, 40, 41, 56, 437/57, 228, 186, 195, 200, 54, 56, 57, 59, 192, 193

[56] References Cited

U.S. PATENT DOCUMENTS

| | | | |
|---|---|---|---|
| 3,889,359 | 7/1975 | Rand | 437/200 |
| 4,072,545 | 2/1978 | De La Moneda | 437/31 |
| 4,102,733 | 7/1978 | De La Moneda et al. | 437/200 |
| 4,392,150 | 7/1983 | Courreges | 437/200 |
| 4,412,237 | 10/1983 | Matsumura | 357/45 |
| 4,413,403 | 11/1983 | Ariizumi | 437/41 |
| 4,462,149 | 7/1984 | Schwabe | 437/200 |
| 4,682,403 | 7/1987 | Hartmann et al. | 437/34 |
| 4,892,845 | 1/1990 | Bridges | 437/195 |

FOREIGN PATENT DOCUMENTS 2151847 7/1985 European Pat. Off. ............ 437/200

OTHER PUBLICATIONS

S. Simon Wong, et al., *HPSAC—A Silicided Amorphous-Silicon Contact and Interconnect Technology for VLSI*, "IEEE Transactions on Electron Devices", vol. ED-34, No. 3, Mar. 1987, pp. 587–592.

Gargini, "Tungsten Barrier Eliminates VLSI Circuit Shorts", Industrial Research and Development, Mar. 1983, pp. 141–147.

*Primary Examiner*—Brian E. Hearn
*Assistant Examiner*—Tom Thomas
*Attorney, Agent, or Firm*—Foley & Lardner

[57] ABSTRACT

There is disclosed a method for the production of semiconductor devices, which has a process for forming an active region and isolation region on a semiconductor substrate, a gate dioxide layer on both active and isolating regions, and a gate electrode on the active region and an interconnection on the isolation region respectively, by patterning a conductive layer after the conductive layer is piled on the gate dioxide layer; a process for forming a diffused region on the active region by patterning through the gate electrode and interconnection as masks, and an inter-level dioxide layer on a pattern formed surface of these regions; a process for forming holes for directly connecting the diffused layer with interconnection and interconnecting the interconnection by partially and selectively eliminating the inter-level dioxide layer; and a process for selectively forming metal layers at bottoms of the holes.

6 Claims, 3 Drawing Sheets

METHOD FOR INTERCONNECTING SEMICONDUCTOR DEVICES

BACKGROUND OF THE INVENTION

The present invention relates to a method for the production of semiconductor devices, and particularly, to a method capable of providing a direct interconnection between a diffused region and an interconnecting portion even though the region and portion have either n-type or p-type conductivity, so that the production process is simplified.

In the miniaturization of an integrated circuit (IC), it is generally important that the poly-crystal silicon (Si) used as a gate electrode is directly connected with diffusional regions by use of the poly-crystal silicon as an interconnecting portion. The general method, which is used in the above-mentioned technology, will be explained with reference to FIG. 1.

In the first step, as shown in FIG. 1(a), an oxidized layer 2 for isolation of the active regions is formed on a semiconductor such as silicon substrate 1 by means of a selective oxidation process such as the localized oxidization of silicon (LOCOS). A gate oxidized layer 3 made of silicon dioxide ($SiO_2$) is formed by hydrochloric acid (HCl) oxidization or the like with a thickness of 10 nanometers (nm). After that, a polysilicon layer 4 is formed on the layer 3, with a thickness of 150 nm by means of a chemical vapor deposition (a CVD) method. A mask is formed in order to form a hole for connecting the polysilicon layer 4 with a diffusion layer region which will be described later by means of a photoetching process, and then a resist layer is coated on the layer 4 with a thickness of the stated length (as shown in FIG. 1(a)).

After that, as shown in FIG. 1(b), the hole for connecting the polysilicon layer 4 with the diffused region in the manner that the resist layer 5 is used as a mask, and a dry etching process such as a non-isotropic reactive ion etching is used. A part of the gate dioxide layer 3, which exists at the bottom of the hole for connection, is eliminated by using ammonium fluoride ($NH_4F$) or the like after the resist layer 5 is eliminated. A polysilicon layer 7 is formed by means of the CVD method, to a thickness of 50 nm, and then a diffused region 8 is formed in the manner whereby ions of $5 \times 10^{15}/cm^2$ of phosphorus (P) is injected into the layer 7 using 50 KeV of energy (as shown in FIG. 1(b)).

A polysilicon layer 9 is then stacked on the layer 7, to a thickness of 100 nm by means of the CVD. The semiconductor substrate is treated with heat at 900 degrees for thirty minutes in an atmosphere of phosphorus oxychloride ($POCl_3$), so that the stacked polysilicon layers 4, 7 and 9 have a lower electric resistance and so that the diffused region 8 is electrically activated.

Then, a resist layer 10 is coated on the polysilicon layer 9 to the thickness of the stated value, and a mask is formed by means of the photoetching process in order to form an interconnection which connects a gate electrode with the diffused region 8 (refer to FIG. 1(b)).

As shown in FIG. 1(c), the polysilicon layers 4, 7 and 9 are etched by non-isotropic reactive ion etching using the resist layer 10 as the mask, which is processed in the predetermined shape, so that a gate electrode 11a and an interconnection 11b are formed, and the interconnection 11b is formed in order to connect a diffused region which will be mentioned later.

After that, diffused regions 13a and 13b are formed using the gate electrode 11a as the mask by means of the ion infection of $5 \times 10^{15}/cm^2$. Of arsenic (As) and 50 KeV of energy (See FIG. 1(c)).

As shown in FIG. 1(d), an inter-level dioxide layer 14 is formed in the manner whereby silicon-dioxide ($SiO_2$) is stacked on the polysilicon layer 9 and the hole of the layers 4, 7 and 9, to a thickness of 500 nm and by means of the CVD method. A connection hole 15a is made to connect with the diffused region 13a while a connection hole 15b is made to connect with the interconnection 11b. After that, a metal interconnection 16 is formed in the manner whereby aluminum (Al) is piled up on the surface with a thickness of 500 nm by a spattering method and using the combination with the photoetching process and non-isotropic reactive ion etching, so that the semiconductor device is completed.

However, since the diffused regions 13a and 13b have to be of the same conductive type as the interconnection 11a and 11b in order to directly connect with the regions 13a and 13b respectively, when the conventional method is used, the diffused region 13 is capable of directly connecting with the interconnection 11 only when both conductive types of the interconnection 11 and region 13 are the same. For instance, when the interconnection 11 is of the n-type, the interconnection 11 only connects with the diffused region 13 having the n conductive type.

Furthermore, it is a problem that a portion 12 generates electrical leaks easily so as to cause the characteristics of the semiconductor device to deteriorate, because the portion 12 of the silicon substrate 1 is etched with the etching of the polysilicon layers 4, 7 and 9, as shown in FIG. 1(c).

In addition, it is necessary not only that the photoetching process be performed twice in order to make the connection hole for directly connecting the interconnection 11b with the diffused region 13b, but also that the polysilicon layers are stacked three times. Furthermore, it is also necessary to perform high-density ion injection twice, so that the complexity of the entire process begins to become a problem.

SUMMARY OF THE INVENTION

In order to achieve the above-mentioned problems, the object of the present invention is to provide a method for the production of semiconductor devices and which is capable of the connection of diffused regions and interconnections of any conductive type, of simplifying the manufacturing process, and of not reducing the characteristics of the semiconductor devices.

A method for the production of semiconductor devices according to the present invention comprises a step for forming active regions and isolation regions on a semiconductor substrate, a step for forming gate oxide layers on the active and rsolation regions, a step for respectively forming a gate electrode on the active regions and interconnections at the predetermined portions on the isolation regions by stacking and patterning a polysilicon layer on the gate oxide layers, a step for forming a diffused region on the active regions and using the gate electrode and interconnections as masks, a step for forming an inter-level dioxide layer on a pattern-formed surface of the semiconductor substrate, a step for forming connection holes made by partially and selectively eliminating the inter-level dioxide layer and directly connecting interconnections with the diffusional regions and interconnections respectively, and a step for selectively forming a metal layer at the bottom of the connection holes.

By using the above-mentioned method for the production of semiconductor devices according to the present invention, it is possible to simplify the manufacturing process when compared with the conventional method on the basis that it is unnecessary to eliminate the gate dioxide layer in regions directly connecting the diffusional region with interconnections, and that the polysilicon layer is formed in one step.

Since the gate oxide layer is not eliminated, electrical leaks do not occur due to no etching of the semiconductor substrate occurring when the interconnections are formed as in the conventional method, so that it is possible for this invention to prevent deterioration of the characteristics of the semiconductor device.

Since the gate oxide layer is put between the interconnection and the diffused region which are interconnected by the formation of the metal layer, and since the gate oxide layer forms a barrier to the diffusion of the polysilicon, it is unnecessary that the interconnection be of the same conductive type as the diffused region.

Accordingly, by the present invention, it is possible to connect the diffused region with the interconnection even if they are any conductive type, and to also simplify the manufacturing process. Furthermore, it is possible to prevent the deterioration of the characteristics of a semiconductor device manufactured by the manufacturing process of this invention.

DETAILED DESCRIPTION OF THE PREFERRED EMBODIMENTS

FIGS. 2 and 3 show the preferred embodiments of a method for the production of semiconductor devices, respectively, according to the present invention.

At first, there will be described an embodiment of a manufacturing process of semiconductor devices according to this invention with reference to FIGS. 2(a) to 2(d).

Figure 1A:
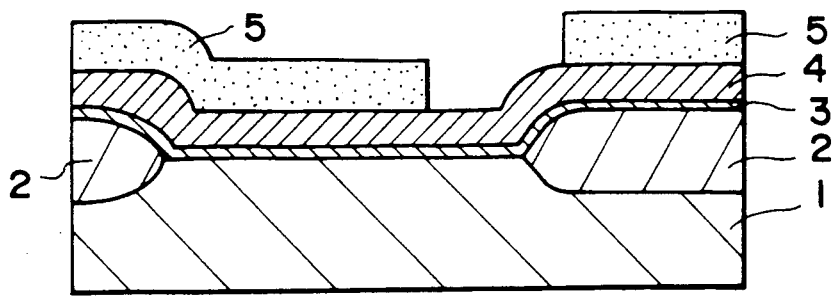
FIGS. 1(a) to 1(d) are sectional views showing the manufacturing process of a semiconductor device according to a conventional method.
Figure 1B:
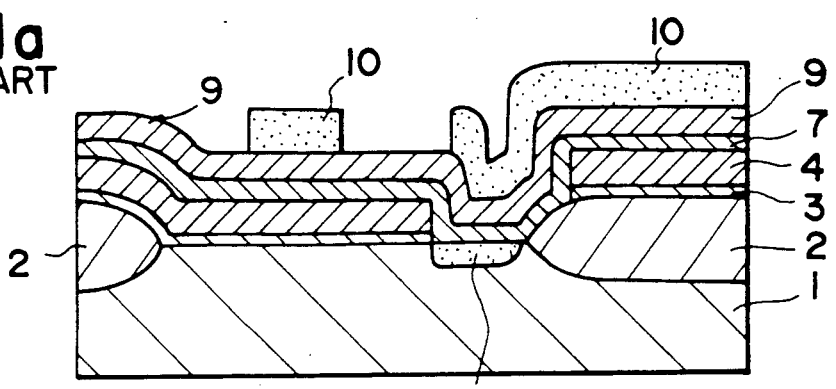
Figure 1C:
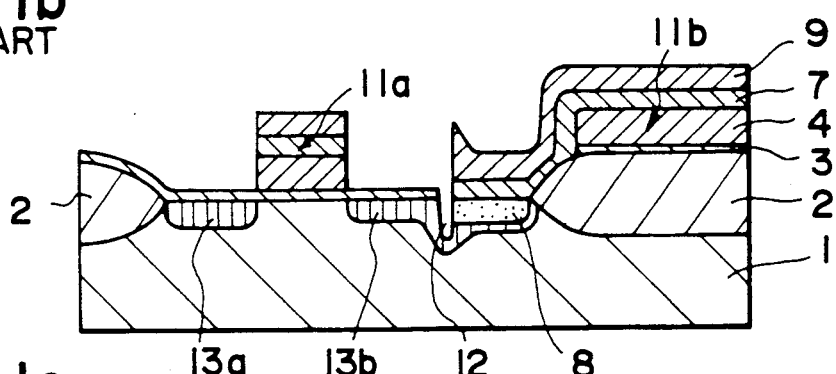
Figure 1D:
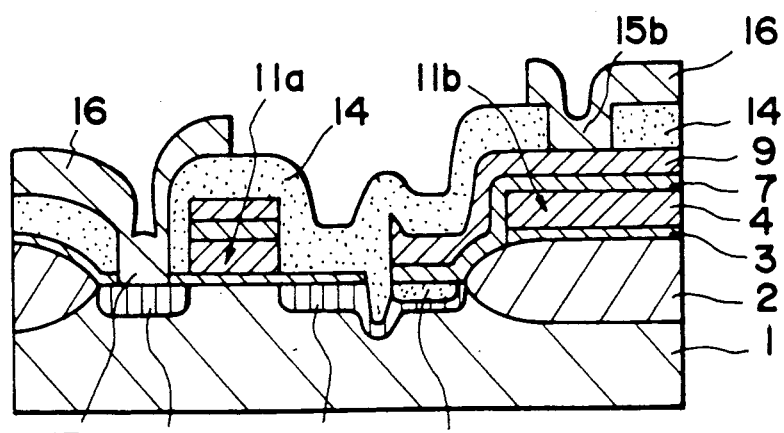
Figure 2A:
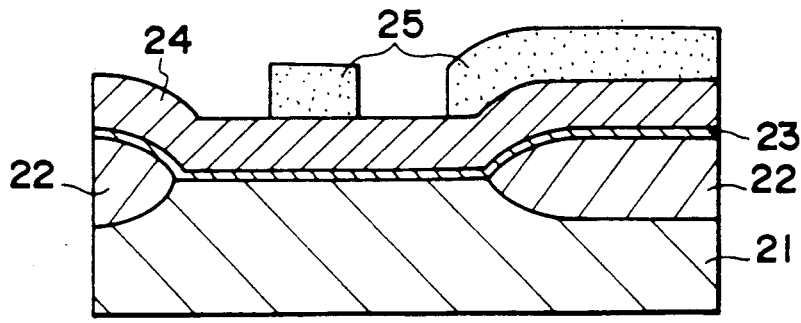
FIGS. 2(a) to 2(d) are sectional views showing the manufacturing process of a semiconductor device according to an embodiment of the present invention.

As shown in FIG. 2(a), an isolation region 22 made of SiO2 is formed on a Si substrate 21 having a first conductive type by means of a LOCOS. After that, a gate dioxide layer 23 is formed on a surface with a thickness of 10 nm in an oxidation atmosphere of 10% HCl at 800° C. A poly-crystal Si layer 24 is stacked on the layer 23 by CVD with a thickness of 400 nm and treated by 900° C. heat in an atmosphere of phosphorus oxychloride (POCl3) for thirty minutes so as to form a gate electrode and interconnections. The above heat treatment is performed to cause the poly-crystal Si layer 24 to have a lower resistance. A resist layer 25 is then coated on the layer 24, to the predetermined thickness (such as 1.5 μm), and is processed by patterning by means of photoetching.

Figure 2B:
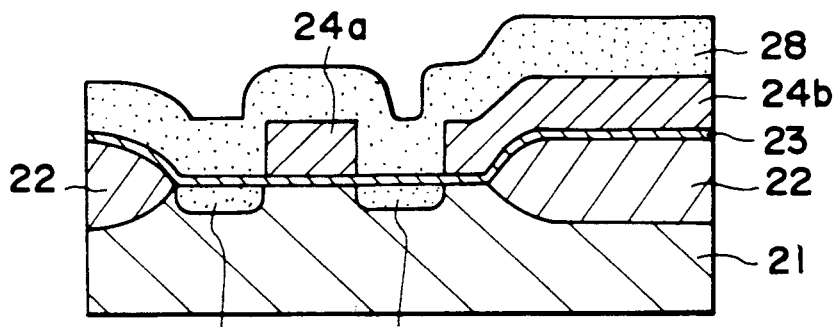

In the next step as shown in FIG. 2(b), the poly-crystal Si layer 24 is processed by patterning, to form a gate electrode 24a and an interconnection 24b by non-isotropic reactive ion etching using the resist layer 25 processed by patterning as a mask. Arsenic (As) ions of $5 \times 10^{15}$ cm$^2$ are injected into the substrate 21 by 40 KeV of energy through the gate electrode 24a and the interconnection 24b as the mask so as to form diffused regions 27a and 27b.

After that, an SiO2 layer 28 is stacked on the surface to a thickness of 500 nm by a CVD in order to use it as an inter-level dioxide layer. The inter-level dioxide layer 28 is processed by a combination of photoetching and non-isotropic reactive ion etching so as to form connection holes 29, 30 and 31 at one time. The hole 29 is used for directly connecting the interconnection 24b with the diffused region 27b, the hole 30 for connecting the diffused region 27a, and the hole 31 for connecting the interconnection 24b.

Figure 2C:
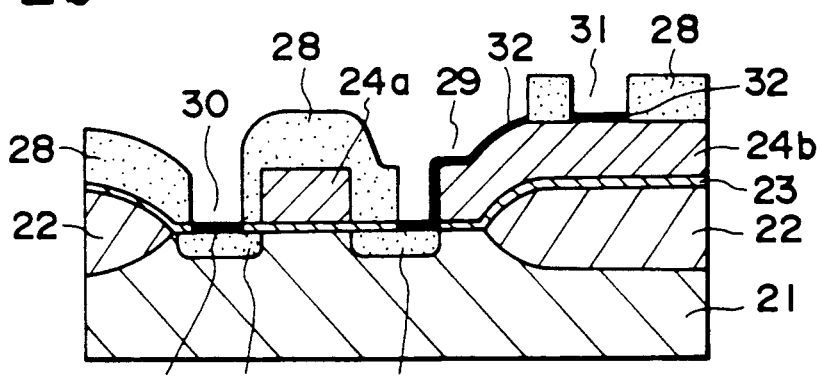

At the bottoms of connection holes 29, 30 and 31, tungsten layers 32 . . . are formed with a thickness of 100 to 200 nm by means of tungsten CVD, for instance, by using tungsten hexafluoride (WF6). The tungsten layers 32 . . . have the covered shape as shown in FIG. 2(c) because of selective deposition on only silicon (Si).

Figure 2D:
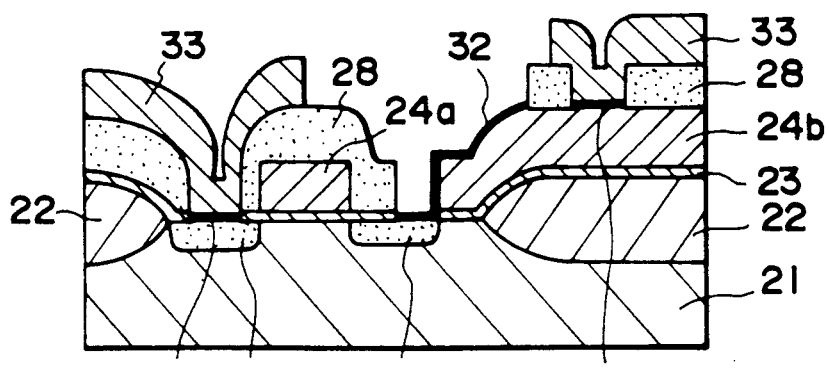

At last, as shown in FIG. 2(d), aluminum is piled on the layers 28 and the layers 32 in the holes 30 and 31 by a spattering method, to a thickness of 500 nm and is treated by patterning with combination of photoetching and non-isotropic reactive ion etching so as to form aluminum interconnections 33 as a metal interconnection, to thereby complete the semiconductor device.

As described above in detail, this embodiment obtains the specific effect that the manufacturing process is simplified when compared with the conventional method, because the number of photoetchings is one less when compared with the conventional process, because it is unnecessary to eliminate the gate dioxide layer 23 existing in the region in which the poly-crystal Si layer 24b is directly connected with the diffusional region 27b, and because it is possible to form the poly-crystal Si layer 24 in one step unlike the conventional method. As the gate dioxide layer 23 is not eliminated, electrical leaks do not occur due to no etching of the Si substrate 21 when using the conventional method, and so it is possible to prevent deterioration of the characteristics of the semiconductor device.

It is further possible for this embodiment to extremely reduce the value of the contact resistance because the interconnection 24b is connected with the diffused region 27b by covering the entire exposed portion of silicon (Si) by tungsten.

Furthermore, since the gate dioxide layer 23 provided between the diffused region 27b and the interconnection 24b connected by the covering of tungsten, functions as a barrier to diffusion, it is unnecessary to use the same conductive type Si for the interconnection 24b and the diffusional region 27b, therefore it making possible to connect between any conductive type.

Though this embodiment uses phosphorus diffusion in order to obtain a lower resistance of the poly-crystal Si layer which is used as the gate electrode 24a and the interconnection 24b, the present invention is not restricted to this embodiment and may obtain the same effect by means of a method for electrically activating the poly-crystal Si layer into which is injected ions of arsenic (As) or boron (B) and which is treated with heat.

Furthermore, though the diffusional regions 27a and 27b are formed by the injection of arsenic (As) ions in this embodiment, the present invention is not restricted to this embodiment either, but may have the diffused region of the P conductive type which is obtained by ion injection of boron difluoride (BF$_2$) of $5 \times 10^{15}$ cm$^2$ using an acceleration energy of 50 KeV.

Though the tungsten layer is selectively formed in this embodiment, the same effect may be obtained by the selectively silicifying only the exposed region of silicon (Si) into titanium (Ti) silicide in the manner that titanium (Ti) is heaped on the silicon substrate and heat-treated at 700° C.

Furthermore, the gate electrode and the interconnection are made of poly-crystal silicon as material, the present invention may form them using a stack construction which comprises poly-crystal silicon and titanium (Ti), tungsten (W) or molybdenum (Mo) silicide further stacked on the poly-crystal Si layer, is treated by patterning. It is also possible to use tungsten (W), molybdenum (Mo), titanium nitride (TiN) and so on as material of the gate electrode.

Figure 3A:
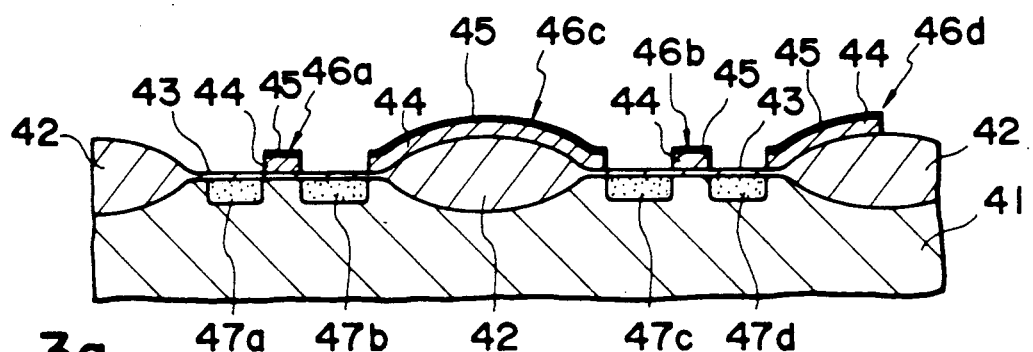
FIGS. 3(a) to 3(c) are sectional views showing the manufacturing process of a semiconductor device according to a second embodiment of the present invention.
Figure 3B:
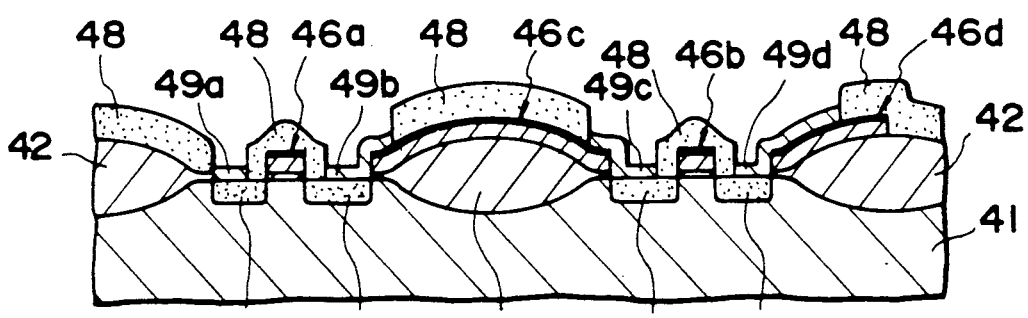
Figure 3C:
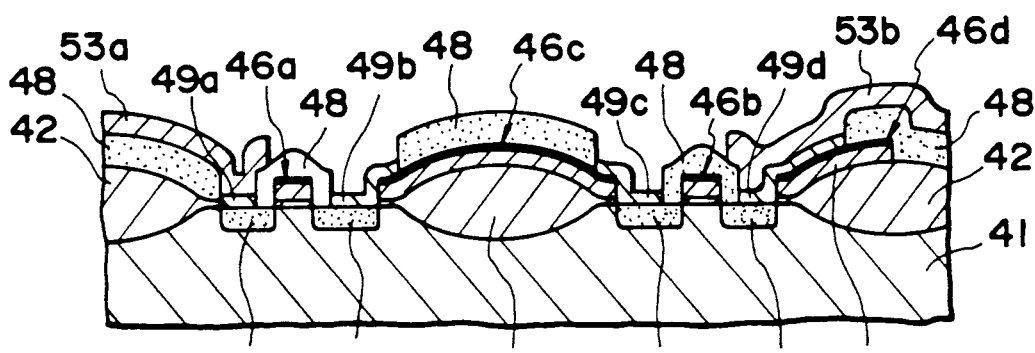

FIGS. 3(a) to 3(c) show a second embodiment of the method for the production of a semiconductor device according to the present invention. As shown in FIG. 3(a), on an Si substrate 41 having the first conductive type, an isolation region 42 consisting of SiO$_2$ is formed by the LOCOS. After that, a gate isolation layer 43 is formed to a thickness of 10 nm. A poly-crystal Si layer 44 to be a gate electrode and an interconnection and a tungsten silicide (WSi) layer 45 for causing the semiconductor device to have lower resistance, are stacked one by one, and then gate electrodes 46a and 46b and interconnections 46c and 46d are formed by patterning using a combination of photoetching and non-isotropic reactive ion etching. Diffusional regions 47a to 47d are formed by the ion injection of impurities through the gate electrodes 46a and 46b and the interconnections 46c and 46d as mask (refer to FIG. 3(a)).

After that, an SiO$_2$ layer 48 as an inter-level dioxide layer is stacked on the surface including the isolation region 42, the gate isolation layer 43, the poly-crystal Si layer 44, the gate electrodes 46a and 46b, and the interconnectrons 46c and 46d. The SiO$_2$ layer 48 is treated by patterning on the basis of the combination of photoetching and non-isotropic reactive ion etching so as to make connection holes in one step, in order to connect the diffused region 47a, to connect the interconnection 46c with the diffused regions 47b and 47c, respectively, and to connect the intrreconnection 46d with the diffused region 47d.

Furthermore, tungsten layers 49a, 49b, 49c and 49d are formed at respective connection holes by the CVD of tungsten (W) such as tungsten hexafluoride (WF$_6$), as shown in FIG. 3(b).

After that, aluminum (Al) as a metal interconnection is stacked on the surface to a thickness of 500 nm by means of spattering, thereby forming metal interconnections 53a and 53b by means of combination of photoetching and non-isotropic reactive ion etching, so that the semiconductor device is completed.

As described above, the second embodiment which is the same effect as the first embodiment is capable of connecting the diffused regions with interconnections even if they are of any conductive type, and of simplifying manufacturing process. Furthermore, it is possible for the manufacturing process of the second embodiment to prevent deterioration of the characteristics of the semiconductor devices produced thereby.

What is claimed is:

1. A method of manufacturing semiconductor devices, comprising
    a first step of forming an active region and an isolation region on a semiconductor substrate;
    a second step of forming a gate dioxide layer having a predetermined thickness on said active region and said isolation region;
    a third step of forming a gate electrode on said active region, and an interconnection at a predetermined portion on said isolation region by stacking a conductive layer on said gate dioxide layer and patterning the conductive layer so that a predetermined pattern is formed;
    a fourth step of forming a diffusional region on said active region through masking using said gate electrode and interconnection;
    a fifth step of forming an inter-level dioxide layer on a pattern-formed surface of said semiconductor substrate having said predetermined pattern formed by said third step;
    a sixth step of forming at the same time a first connection hole for directly connecting said diffusional region with said interconnection and a second connection hole for connecting a plurality of interconnections to each other, respectively, by partially and selectively eliminating said inter-level dioxide layer; and
    a seventh step of selectively forming a metal layer at the bottoms of said first and second connection holes and having a predetermined thickness which is thicker than said predetermined thickness of said gate dioxide layer.

2. A method according to claim 1;
    wherein said metal layer is selectively formed against a remaining portion of said inter-level dioxide layer by means of a chemical vapor deposition (CVD) of tungsten (W) in said step process.

3. A method according to claim 1;
    wherein said metal layer is selectively formed against a remaining portion of said inter-level dioxide layer by means of selective silification of titanium (Ti) silicide by heat treatment after forming a Ti layer in said seventh step.

4. A method according to claim 1;
    wherein said gate electrode is formed of a poly-crystal silicon and a metal having a high fusion point as materials in said second process to said third step.

5. A method according to claim 1;
    wherein said gate electrode is formed using poly-crystal silicon and metal silicide as materials, in which said metal has a high fusion point, in said second process to said third step.

6. A method according to claim 1;
    wherein said gate electrode is formed using tungsten silicide (WSi) as the material in said second step to said third step.

* * * * *